US006961240B2

(12) United States Patent
Janicek

(10) Patent No.: US 6,961,240 B2
(45) Date of Patent: Nov. 1, 2005

(54) DEVICE FOOT INCORPORATING LID-ACTUATED EXTENSION MEMBER

(75) Inventor: Michael Janicek, Cupertino, CA (US)

(73) Assignee: Gateway Inc., Irvine, CA (US)

( * ) Notice: Subject to any disclaimer, the term of this patent is extended or adjusted under 35 U.S.C. 154(b) by 237 days.

(21) Appl. No.: 10/631,398

(22) Filed: Jul. 31, 2003

(65) Prior Publication Data

US 2005/0024822 A1 Feb. 3, 2005

(51) Int. Cl.[7] ............................................. H05K 7/20
(52) U.S. Cl. ................... 361/687; 361/680; 361/699; 361/710; 70/57; 292/148; 220/241
(58) Field of Search ......................... 361/680–687, 361/692–699, 702–715; 292/42, 148, 151, 307 R; 70/58, 57, 85; 220/241, 326; 312/271; 248/688, 685, 923, 917; 16/366; 206/45.2, 45.23, 305, 320

(56) References Cited

U.S. PATENT DOCUMENTS

| 5,347,424 | A | * | 9/1994 | Akahane ..................... 361/680 |
| 5,469,327 | A | | 11/1995 | Cheng |
| 5,737,183 | A | * | 4/1998 | Kobayashi et al. .......... 361/683 |
| 5,828,552 | A | * | 10/1998 | Ma ............................. 361/704 |
| 6,053,589 | A | * | 4/2000 | Lin ............................. 312/271 |
| 6,097,592 | A | | 8/2000 | Seo et al. |
| 6,097,595 | A | | 8/2000 | Cipolla |
| 6,181,554 | B1 | | 1/2001 | Cipolla et al. |
| 6,282,084 | B1 | | 8/2001 | Goerdt et al. |
| 6,414,842 | B1 | | 7/2002 | Cipolla et al. |
| 6,473,296 | B2 | * | 10/2002 | Amemiya et al. ........... 361/683 |

FOREIGN PATENT DOCUMENTS

| JP | 404216116 A | * | 8/1992 | ............. G06F/3/02 |
| JP | 2000112573 A | * | 4/2000 | ............. G06F/1/20 |

* cited by examiner

*Primary Examiner*—Michael Datskovskiy
(74) *Attorney, Agent, or Firm*—Robert Scott

(57) ABSTRACT

A lid actuated device foot lifts a device to facilitate cooling. The device foot includes a device lid, and at least one lifting cam coupled to the device lid through a hinge. The lifting cam rotates about the hinge on an axis and has an eccentric contact surface capable of contacting a supporting surface. The device is thus lifted when the device lid is moved to a first position corresponding to an operational state thereby rotating the lifting cam about the axis. The contact surface is non-lifting when the device lid is in a second position corresponding to a non-operational state of the device.

20 Claims, 4 Drawing Sheets

DEVICE FOOT INCORPORATING LID-ACTUATED EXTENSION MEMBER

FIELD OF THE INVENTION

The present invention generally relates to enclosures for electronic devices. In particular the present invention relates to a device foot for raising an electronic device for enhanced cooling when a lid is operated.

BACKGROUND OF THE INVENTION

Thermal management has been a persistent issue with virtually all electronic devices including portable computers. Many solutions exist to the thermal issue depending on the device configuration and the typical manner of use of the device. Passive cooling, active cooling and a combination of passive and active cooling may be employed depending on the mode of operation of the device or system. For example with stationary equipment, thermal management may take the form of an auxiliary cooling system and the like designed to promote cooling taking into account the stationary nature of the equipment. At one extreme, systems producing large amounts of heat may be cryogenically cooled by routing a coolant such as liquid nitrogen throughout the heat generating areas of the system. More often, systems are provided with passive structures such as high surface area heat sinks constructed of materials such as aluminum with high thermal conductivity and additionally may contain fans or the like to draw hot air out of the enclosure.

Problems arise however, in that if fan exhaust ports, or surfaces designed to conduct heat to the atmosphere, are blocked such that they cannot exhaust, or conducting surfaces are not exposed to circulating air, thermal energy can quickly build within enclosures causing component failure or, in the extreme, catastrophic damage such as fire, meltdown, or the like.

Some systems such as that described in U.S. Pat. No. 6,181,554, issued on Jan. 30, 2001 to Cipolla et al., rely on an extensive redesign of the entire enclosure, or alternatively on an external supplemental enclosure having spring loaded posts raising the heat generating portion of the device such that passive cooling is enhanced. Obvious disadvantages of the system of Cipolla et al. include the expense of the additional components such as latches, posts, springs and the like. In addition the relatively complex mechanism would be more likely to experience failure.

Other systems, such as that described in U.S. Pat. No. 5,469,327 issued on Nov. 21, 1995 to Cheng, rely on supporting legs each of which may be directly and independently rotated to the support position on a central pivot. In U.S. Pat. No. 6,097,592 issued on Aug. 1, 2000 to Seo, et al. legs are also described which may be directly operated and rotated into position to support the computer enclosure in an elevated position. However, a user may forget to operate the legs defeating the elevation of the enclosure.

It should be noted that disadvantages are present in the above described systems notably that direct, manual operation of one or more of the legs may be overlooked during operation of the system frustrating the beneficial effects thereof. Accordingly, it would be desirable in the art for a device foot, leg, raising mechanism or the like, which could be deployed in a manner which would not rely on direct manual operation but rather would raise an enclosure associated with a device sufficiently to facilitate cooling every time the device is operated.

SUMMARY OF THE INVENTION

Accordingly, in one exemplary embodiment, the present invention is directed to an apparatus for lifting a device to facilitate cooling. The apparatus of the present invention preferably comprises a device lid, a device base, and at least one lifting cam coupled to the device lid and the device base through a hinge. The lifting cam is preferably capable of rotating about the hinge on an axis and may have at least one eccentric contact surface capable of contacting a supporting surface such as a desk or the like, when the device is placed thereon. The device may thereby be lifted when the device is operated, e.g. the device lid is moved to a first position corresponding to an operational state of the device. By operating the device lid, the lifting cam may be rotated about the axis. It should be noted that the contact surface is preferably in a non-lifting state when the device lid is moved to a second position, e.g. corresponding to a closed, or non-operational state of the device.

In another exemplary embodiment, a key may preferably be used to fixably couple the lifting cam to the hinge. Alternatively, the lifting cam may be molded into the device lid during the construction thereof, e.g. during injection molding or the like, or the lifting cam may further be separate from the device lid. In accordance with various exemplary and alternative exemplary embodiments, the lifting cam may preferably comprise at least one of the following shapes: circular, oval, and elliptical and may extend along a substantial portion of the hinge.

In still another exemplary embodiment, a computer assembly in accordance with the present invention may preferably comprise a device lid, and at least one lifting cam molded into the device lid. The lifting cam is preferably capable of rotating about an axis and may have at least an eccentric contact surface capable of contacting a supporting surface, e.g. a desk or the like, when a device associated with the computer assembly is placed thereon. The device is thus lifted when the device lid is moved to a first position corresponding to an operational state of the device thereby rotating the lifting cam about the axis, e.g. bringing the eccentric surface into engagement with the supporting surface. The contact surface is preferably non-lifting when the device lid is moved to a second position corresponding to a closed or non-operational state of the device. It will be appreciated by one of skill in the art that the lifting cam associated with the computer assembly preferably comprises at least one of the following shapes: circular, oval, and elliptical and may extend along a substantial portion of the device lid.

In still another exemplary embodiment, a lid actuated device foot for lifting a device to facilitate cooling in accordance with the present invention, preferably comprises: a device lid, and at least one lifting cam coupled to the device lid through a hinge. The lifting cam is preferably capable of rotating about the hinge on an axis and has at least an eccentric contact surface capable of contacting a supporting surface, e.g. a desk or the like, when the device is placed thereon. The device may be lifted when the device lid is moved to a first position corresponding to an operational state of the device thereby rotating the lifting cam about the axis. The contact surface is preferably non-lifting when the device lid is moved to a second position corresponding to a closed or non-operational state of the device. The device foot may further preferably comprise a key for fixably coupling the hinge and the lifting cam. In accordance with various exemplary and alternative exemplary embodiments, the lifting cam may be molded into the device lid during construction thereof. Alternatively, the lifting cam may be separate from the device lid. The lifting cam preferably comprises at least one of the following shapes: circular, oval, and elliptical and may extend along a substantial portion of the hinge.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

The present invention thus provides a device foot for lifting an electronic device such as a portable computer or the like to facilitate cooling which device foot is activated automatically when the device lid is raised for device use. It should be noted that several advantages are attendant in the device foot of the present invention associated with coupling the device lifting action with the device lid opening action to be described in greater detail hereinafter. Reference will now be made in detail to the presently preferred embodiments of the invention, examples of which are illustrated in the accompanying drawings.

Figure 1:
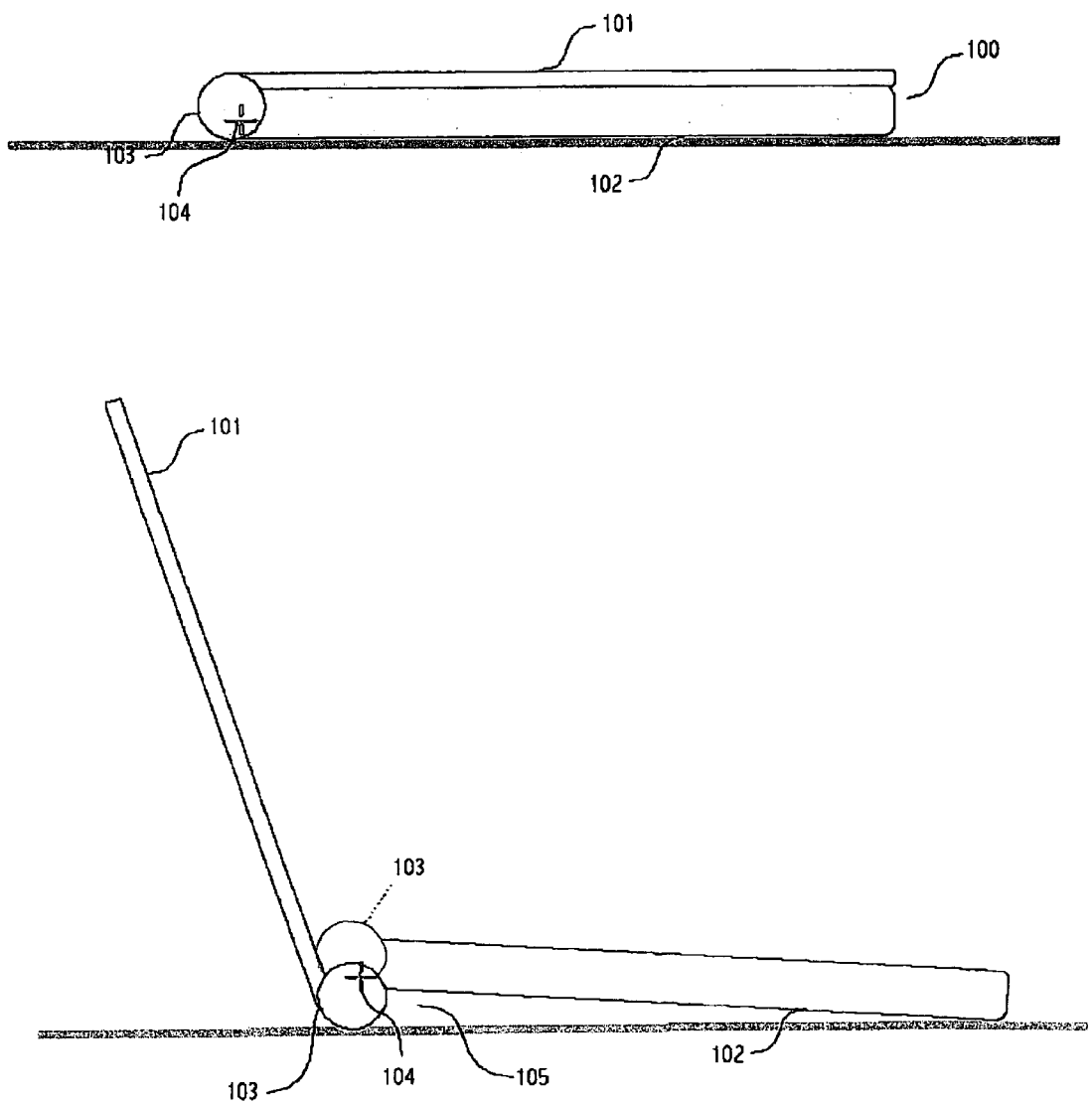
FIG. 1 is a diagram illustrating a laptop computer system employing an exemplary device foot in accordance with various exemplary embodiments of the present invention.

In FIG. 1A, an exemplary device such as portable computer 100 having a device lid 101 and a device base 102 may be positioned in an inactive or closed state on a surface such as a table or a desktop. In such a position, portable computer 100 may be plugged into a wall outlet, charging, or simply idle. In some instances, portable computer 100 may be plugged into an external keyboard and display, both being necessary for the operation of the computer in the closed position. While such an operational scenario is possible, it is more likely that such operation would be additionally accompanied by a docking station to allow for cooling to be accomplished through auxiliary fans, heat-sinking surfaces or the like.

In accordance with various exemplary embodiments, portable computer 100 may further be provided with lifting cam 103 and hinge 104. Lifting cam 103 may be a separate piece which is fitted between device lid 101 and device base 102 on hinge 104. It should be noted that lifting cam 103 may include two or more pieces positioned at each point along hinge 104 where device lid 101 and device base 102 are joined. It will be appreciated by one of ordinary skill in the art that a key or other means to fix lifting cam 103 to hinge 104 for rotational purposes will be necessary as will be described in greater detail hereinafter. Alternatively, lifting cam 103 may be molded into device lid 103 in a manner known in the art.

Figure 2A:
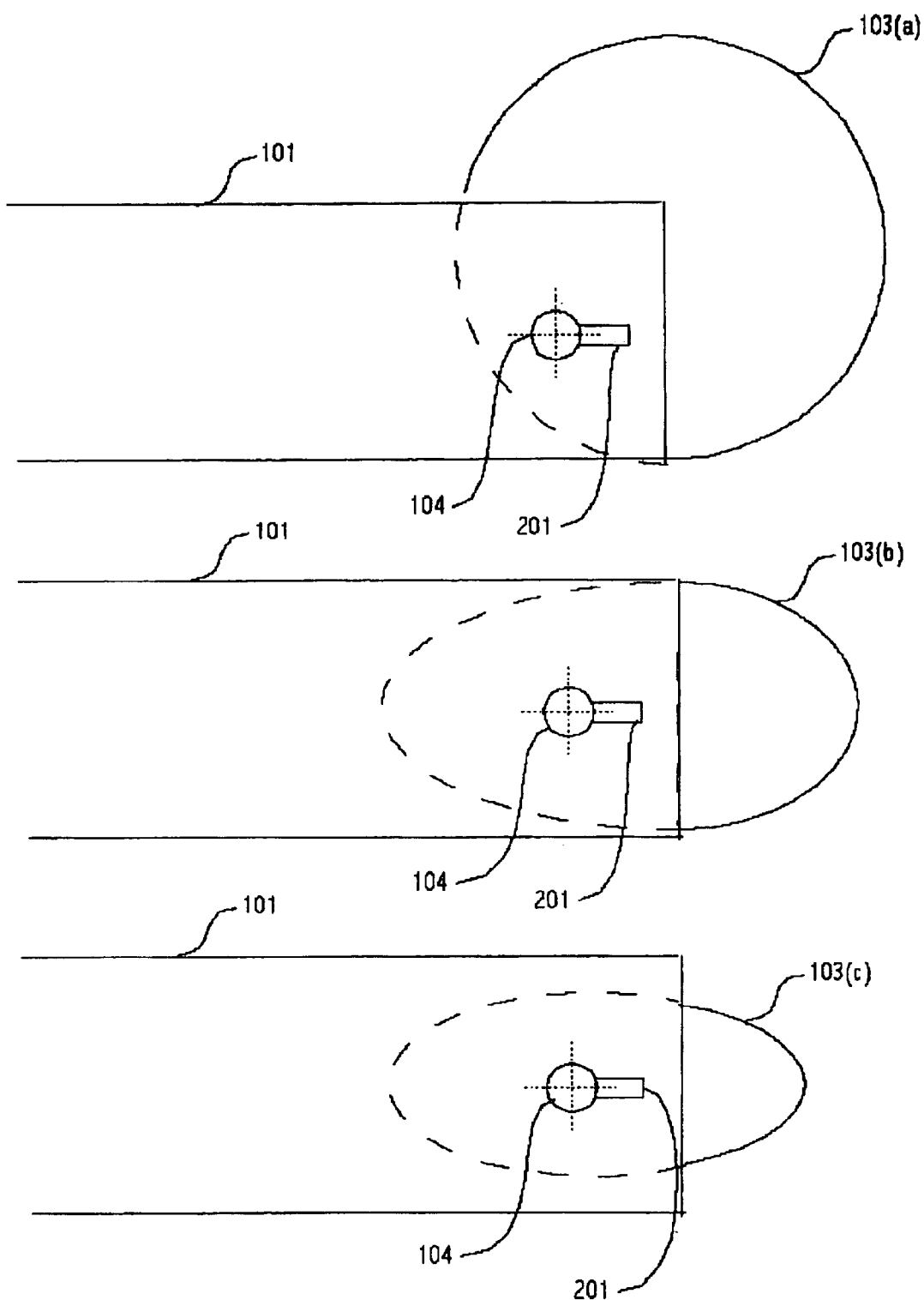
FIG. 2A is a diagram illustrating keyed lifting cam shapes in accordance with various exemplary embodiments of the present invention.

In order to fix lifting cam 103 to hinge 104 for the purposes of driving the rotation thereof and for being able to bear the force needed to support device base 102, lifting cam 103 may be keyed to hinge 104 as illustrated in FIG. 2A using key 201. Key 201 may be made of a plastic, metal or other suitable material and may be incorporated into hinge 104 or alternatively, hinge 104 may have a separate slot to accept key 201 in a manner known in the art. Lifting cam 103 may further require a key slot along with an opening to accommodate hinge 104. It will further be appreciated that hinge 104 may be a single hinge piece such as a metal rod or the like, or may be broken down into several sections. Further, lifting cam 103 may include a single elongated cam extending the length of the hinge joint between device lid 101 and device base 102, or may also be broken into several sections preferably corresponding, for example, to sections of hinge 104.

Figure 2B:
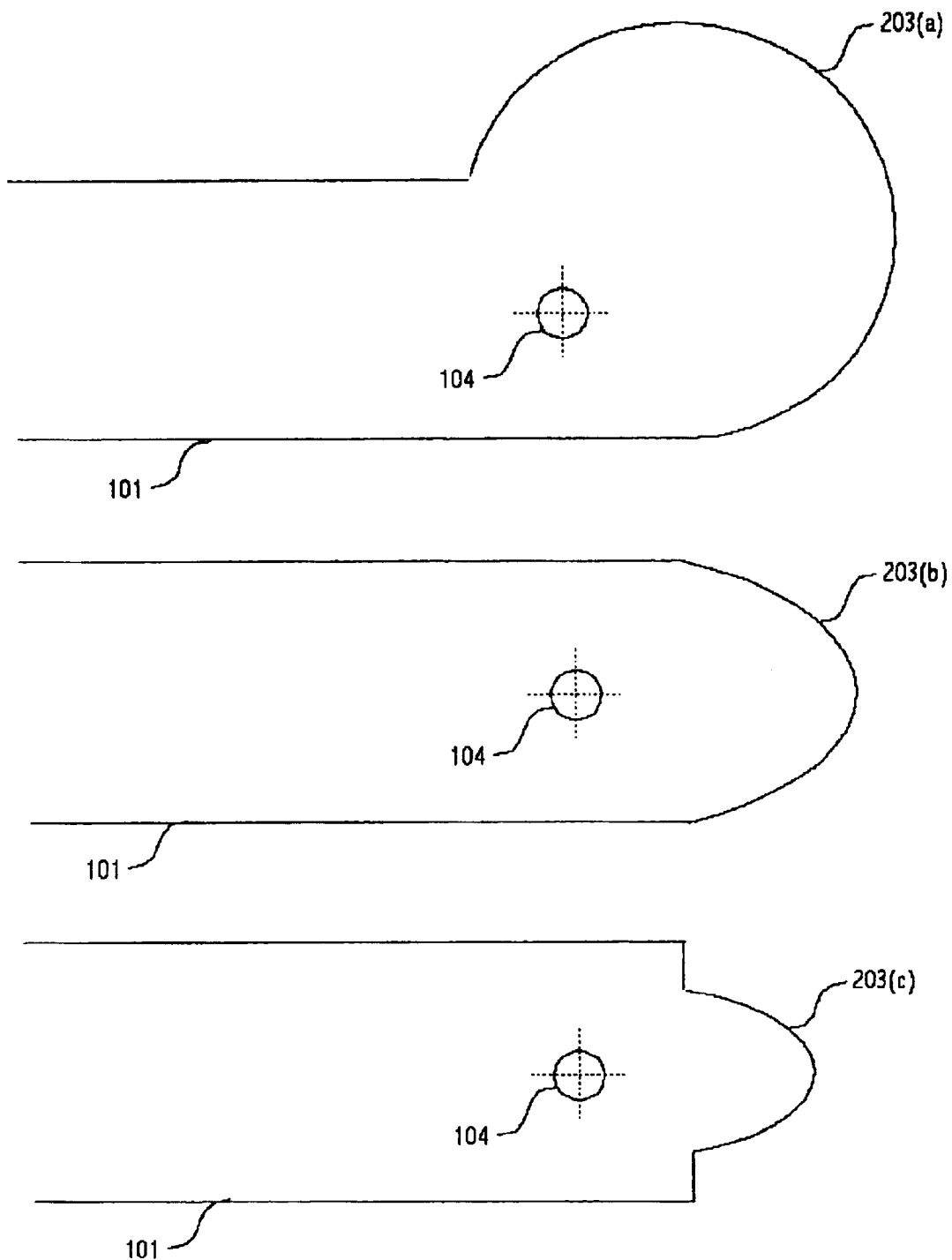
FIG. 2B is a diagram illustrating molded lifting cam shapes in accordance with various exemplary embodiments of the present invention.

Several shapes may be useful for use in lifting cam 103 as long as at least one eccentric surface exists, that is, as long as the shape of the cam is either irregular or, in the case of a circular cam, the axis is off-center. Thus, a circular cam 103(a) may provide a high degree of lift provided that the placement of hinge 104 is sufficiently off-center creating a moment arm for lift. Such placement combined with a relatively large moment arm, will result however in greater torque on key 201. Different shapes may be used however which allow a centered axis of rotation for the lifting cam and a reduced moment arm. Accordingly, oval cam 103(b) or elliptical cam 103(c) may be used to provide lift, while reducing the rotational stress on key 201. It should further be appreciated that lifting cam shapes may be incorporated into device lid 101 as illustrated in FIG. 2B. Circular cam section 203(a) may be incorporated into, for example, a die for the molding of device lid 101 as may oval cam section 203(b) or elliptical cam section 203(c).

Figure 3:
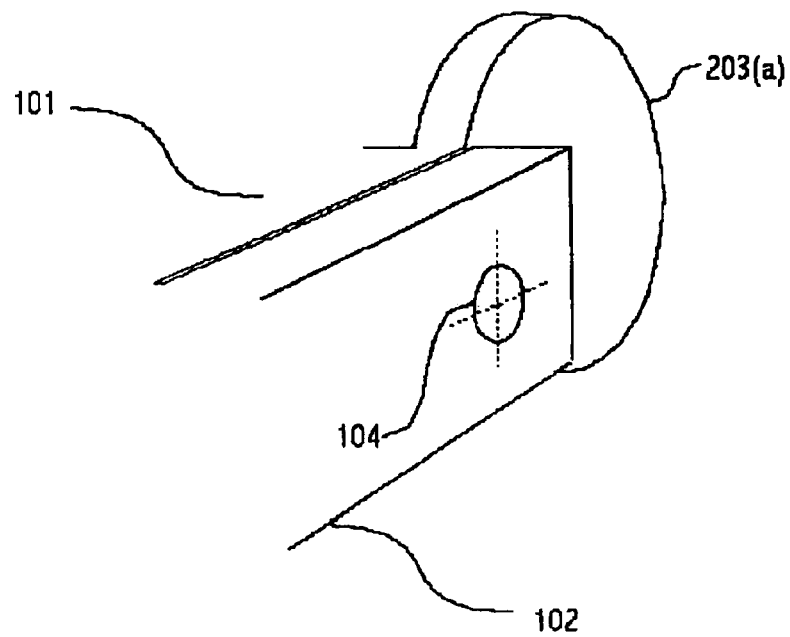
FIG. 3 is a perspective diagram illustrating two alternative embodiments of an exemplary lifting cam in accordance with the present invention.
Figure 3:
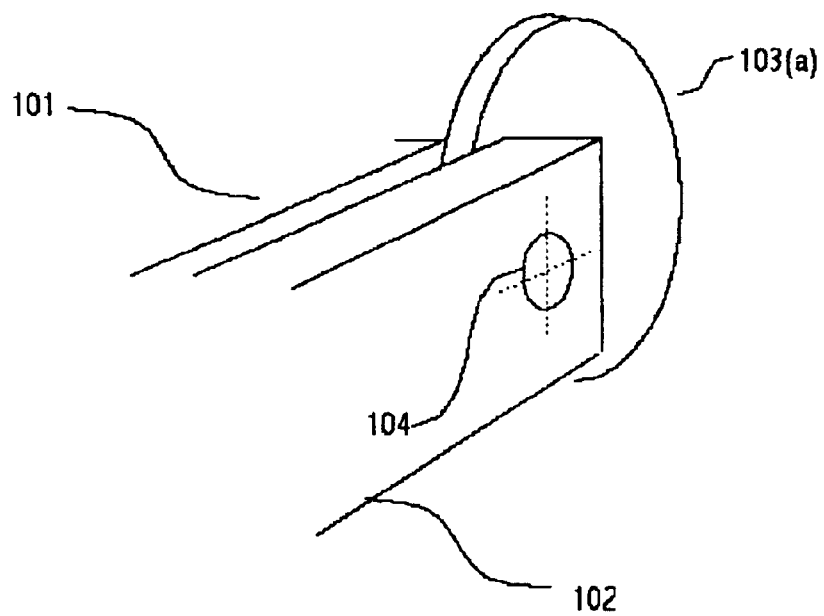

A perspective diagram in FIG. 3 better illustrates various exemplary and alternative exemplary embodiments of the present invention. It can be seen that in accordance with one exemplary embodiment, circular cam 203(a) may be molded or otherwise incorporated into device lid 101 during the manufacture thereof. Device base 102 may then be coupled to device lid 101 through hinge 104 providing an effective fulcrum for the operation of circular cam 203(a) in lifting the device when device lid 101 is opened for operating the device. As previously described, circular cam 203(a) while shown as having a limited width dimension may also be extended the entire length of device lid 101 or a significant portion thereof. Alternatively, circular cam 203(a) may be broken into sections along device lid 203(a) as a way of improving the strength and increasing the likelihood that circular cam 203(a) will contact at least a portion of a supporting surface particularly if the supporting surface is irregular and/or discontinuous. In an alternative exemplary embodiment, circular cam 103(a) may be a separate piece that is fitted between device lid 101 and device base 102 and is further keyed to hinge 104 as described above. It will be appreciated that even in this configuration, e.g. wherein circular cam 103(a) is a separate piece which is keyed to hinge 104, the width of circular cam 103(a) may be varied from relatively thin to relatively thick and may extend the entire length of hinge 104 with a provision for an attachment to device lid 101, or may be broken into sections, preferably at least two of reasonable thickness to allow for optimum support.

It is believed that the device foot of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus for lifting a device to facilitate cooling, the apparatus comprising:
   a device lid;
   a device base; and
   at least one lifting cam coupled to the device lid and the device base through a hinge;
   wherein the lifting cam is configured to be capable of rotating about the hinge on an axis, the lifting cam having at least an eccentric contact surface capable of contacting a supporting surface when the device is placed thereon so as to lift the device upon the device lid being moved to a first position rotating the lifting cam about the axis;
   wherein the first position corresponds to an operational state of the device, the contact surface being non-lifting when the device lid is moved to a second position corresponding to a non-operational state of the device.

2. The apparatus as claimed in claim 1, further comprising a key coupled to the hinge and the lifting cam wherein the key fixably couples the lifting cam to the hinge.

3. The apparatus as claimed in claim 1, wherein the lifting cam is molded into the device lid.

4. The apparatus as claimed in claim 1, wherein the lifting cam is separate from the device lid.

5. The apparatus as claimed in claim 1, wherein the lifting cam comprises at least one of the following shapes: circular, oval, and elliptical.

6. The apparatus as claimed in claim 1, wherein the lifting cam extends along a substantial portion of the hinge.

7. The apparatus as claimed in claim 3, wherein the lifting cam extends along a substantial portion of the hinge.

8. The apparatus as claimed in claim 4, wherein the lifting cam extends along a substantial portion of the hinge.

9. A computer assembly, comprising:
   device lid; and
   at least one lifting cam molded into the device lid;
   wherein the lifting cam is configured to be capable of rotating about an axis, the lifting cam having at least an eccentric contact surface capable of contacting a supporting surface upon a device associated with the computer assembly being placed thereon so as to lift the device in response to the device lid being moved to a first position rotating the lifting cam about the axis;
   wherein the first position corresponds to an operational state of the device, the contact surface being non-lifting when the device lid is moved to a second position corresponding to a non-operational state of the device.

10. The computer assembly as claimed in claim 9, wherein the lifting cam comprises at least one of the following shapes: circular, oval, and elliptical.

11. The computer assembly as claimed in claim 9, wherein the lifting cam extends along a substantial portion of the device lid.

12. The computer assembly as claimed in claim 10, wherein the lifting cam extends along a substantial portion of the device lid.

13. A lid actuated device foot for lifting a device to facilitate cooling, the device foot comprising:
   a device lid; and
   at least one lifting cam coupled to the device lid through a hinge
   wherein the lifting cam is configured to be capable of rotating about an axis, the lifting cam having at least an eccentric contact surface capable of contacting a supporting surface upon a device associated with the computer assembly being placed thereon so as to lift the device in response to the device lid being moved to a first position rotating the lifting cam about the axis;
   wherein the first position corresponds to an operational state of the device, the contact surface being non-lifting when the device lid is moved to a second position corresponding to a non-operational state of the device.

14. The device foot as claimed in claim 13, further comprising a key coupled to the hinge and the lifting cam wherein the key fixably couples the lifting cam to the hinge.

15. The device foot as claimed in claim 13, wherein the lifting cam is molded into the device lid.

16. The device foot as claimed in claim 13, wherein the lifting cam is separate from the device lid.

17. The device foot as claimed in claim 13, wherein the lifting cam comprises at least one of the following shapes: circular, oval, and elliptical.

18. The device foot as claimed in claim 13, wherein the lifting cam extends along a substantial portion of the hinge.

19. The device foot as claimed in claim 15, wherein the lifting cam extends along a substantial portion of the hinge.

20. The device foot as claimed in claim 16, wherein the lifting cam extends along a substantial portion of the hinge.

* * * * *